(12) United States Patent
Moto et al.

(10) Patent No.: US 8,571,078 B2
(45) Date of Patent: Oct. 29, 2013

(54) LASER DRIVER AND OPTICAL TRANSMITTER IMPLEMENTING THE SAME

(75) Inventors: Akihiro Moto, Yokohama (JP); Keiji Tanaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 147 days.

(21) Appl. No.: 13/282,131

(22) Filed: Oct. 26, 2011

(65) Prior Publication Data
US 2012/0106981 A1    May 3, 2012

(30) Foreign Application Priority Data

Oct. 28, 2010 (JP) ................. 2010-242342
Sep. 7, 2011 (JP) ................. 2011-194924

(51) Int. Cl.
H01S 3/00        (2006.01)
(52) U.S. Cl.
USPC ................. 372/38.02; 372/38.07

(58) Field of Classification Search
USPC ............................. 372/38.02, 38.07
See application file for complete search history.

(56) References Cited

U.S. PATENT DOCUMENTS 5,546,218 A *   8/1996  Komatsubara et al. ........ 359/237
2011/0164636 A1*  7/2011  Tanaka ....................... 372/38.02

FOREIGN PATENT DOCUMENTS

JP    2011-023474 A    2/2011

* cited by examiner

*Primary Examiner* — Kinam Park
(74) *Attorney, Agent, or Firm* — Venable LLP; Michael A. Sartori; Tamatane J. Aga

(57) ABSTRACT

An LD-Driver with the push-pull arrangement is disclosed. The driver includes the high side driver driven by the positive phase signal and the low side driver driven by the negative phase signal. When the positive phase signal is in HIGH, the high side driver becomes ON and the LD driver provides additional current to the bias current for the LD; while, when the negative phase signal is in HIGH, the low side driver becomes ON and the LD driver extracts a portion of the bias current for the LD.

14 Claims, 24 Drawing Sheets

LASER DRIVER AND OPTICAL TRANSMITTER IMPLEMENTING THE SAME

BACKGROUND OF THE INVENTION

1. Field of the Invention

The present invention relates to a circuit to driver a semiconductor laser diode (hereafter denoted as LD), and an optical transmitter implementing the laser and the driver.

2. Related Background Arts

A driver circuit to driver a semiconductor optical modulator has been disclosed in the U.S. Pat. No. 5,546,218B. The driver disclosed therein is to stabilize the optical modulation by adjusting a current flowing in a path bypassing the optical modulator dynamically to maintain the amplitude of the modulation signal. This driver includes an output circuit and a compensation circuit. The output circuit, which provides a driving signal to the optical modulator corresponding to a modulation signal input from the outside of the driver, includes an active layer put between an n-type and p-type semiconductor layers, one of which is common to a layer of the LD. The compensation circuit may adjust resistance of a path bypassing the optical modulator to keep the drive voltage of the driving signal constant.

One type of the driver circuit has been known as a shunt-driver to divide bias current provided to the LD. However, the shunt-driver is hard to increase the amplitude of the driving current, which is equivalent to enhance the trans-conductance of the driver. A larger trans-conductance of the driver makes the pre-amplifier put in the upstream of the driver simple and light to drive the driver. In the shunt-driver, an n-MOS transistor implemented therein is necessary to widen the gate width to enhance the trans-conductance, which inevitably increases input capacitance and degrades the high frequency performance of the driver. A shunt-driver implementing with an npn bipolar transistor instead of the n-MOS transistor deforms the output the output waveform. It is quite hard to escape the shunt-driver from such subjects inherently caused therein.

SUMMARY OF THE INVENTION

An aspect of the present application relates to a laser driver that drives an LD. The driver of the present invention, which may be driven by a positive phase signal and a negative phase signal complementary to each other, includes a high side driver and a low side driver. The high side driver, which is driven by the positive phase signal, may provide a positive current to the LD in addition to the bias current provided from a current source. The low side driver, which is driven by the negative phase signal, may extract a negative current from the LD. Thus, the LD may be modulated by the driver.

Another aspect of the present application relates to an optical transmitter applicable to an optical transceiver. The optical transmitter may include an LD, a bias current source, and a driver. The LD may be biased by the current from the bias current source and modulated by the driver. The driver, which may be driven by a positive phase signal and a negative phase signal complementary to each other, includes a high side driver and a low side driver. The high side driver, which is driven by the positive phase signal, may add a positive current to the bias current, while, the low side driver may extract a negative current from the bias current. Thus, the LD may be modulated by the positive and negative phase signals.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

DESCRIPTION OF PREFERRED EMBODIMENTS

Next, some preferred embodiments according to the present invention will be described as referring to accompanying drawings. In the description of the drawings, the same numerals or the symbols will refer to the same elements without overlapping explanations. An optical transmitter 1 according to an embodiment of the present invention is a type of transmitter optical subassembly (hereafter denoted as TOSA) that may output an optical signal by receiving an electrical signal from the outside thereof. The optical transmitter 1 has a laser driver 3 with a type of, what is called, push-pull architecture.

Figure 1:
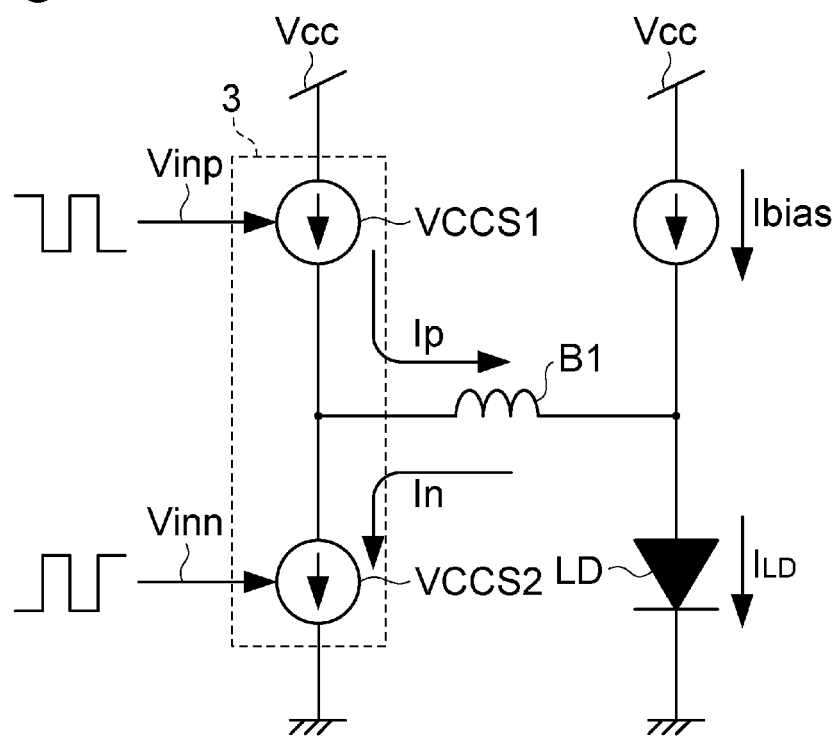
FIG. 1 explains an operation to modulate the LD by the high side driver and the low side driver.

A basic mechanism of the push-pull driver will be first explained by referring to FIG. 1. The optical transmitter 1 primarily includes an LD and a driver 3. The driver 3 may have a voltage controlled current source (hereafter denoted as VCCS) VCCS1 and another current source VCCS2. The first source VCCS1 is put in a side of the power supply Vcc, while, the second source VCCS2 is in a side of the ground. The LD is supplied with a bias current Ibias, which is a DC bias, from another current source put outside of the driver 3. The magnitude of the bias current Ibias may be controlled by an auto power control (hereafter denoted as APC) circuit, and define the average level of the optical signal output from the LD, which is different from an ordinary driver architecture where a bias current defines the low level of the optical signal. The LD is directly grounded GND in the cathode thereof, while, connected in the anode thereof to two current sources, VCCS1 and VCCS2, through a bonding wire B1.

The first current source VCCS1 may output a positive current $I_P$ corresponding to a positive phase signal VinP to the LD through the bonding wire B1. The LD, by receiving the positive current $I_P$, may be active to emit light driven by a superposed current Ibias+$I_P$, which exceeds the bias current Ibias. Here, the term "positive" merely means that the signal has a positive phase relative to the signal with the negative one. On the other hand, the second current source VCCS2, by receiving the signal VinN, generates a negative current $I_N$ which may extract the bias current Ibias and the LD is driven by a extracted current, Ibias−$I_N$, less than the former current Ibias+$I_P$.

Figure 2A:
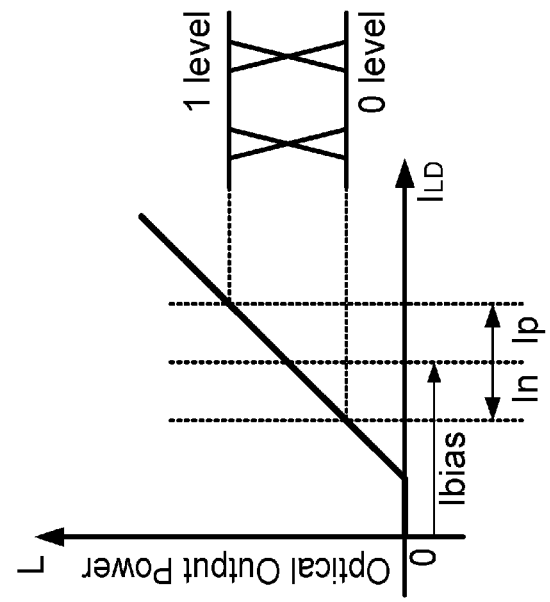
FIGS. 2A and 2B further explain the operation to modulate the LD.

FIG. 2A compares two states of the LD each driven by the superposed current Ibias+$I_P$ or Ibias−$I_N$. The positive current $I_P$ may be modulated by the positive signal VinP, while, the negative current $I_N$ is modulated by the negative signal VinN, where two input signals, VinP and VinN, have an amplitude same to the others but the phases are exactly opposite to the others.

Figure 2B:
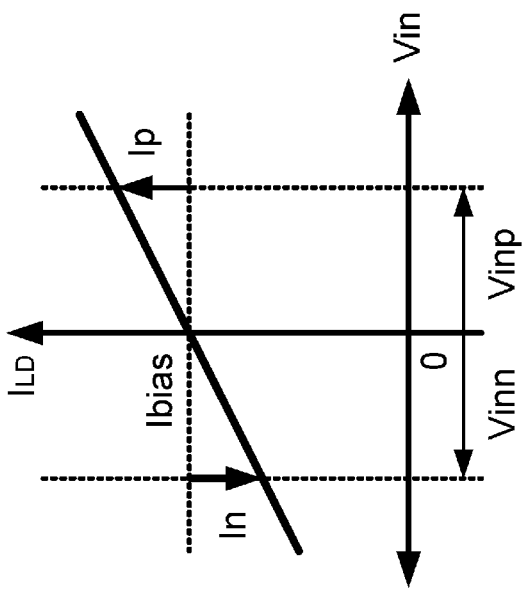

The operation of the driver 3 will be further described. When the positive signal VinP is in HIGH, or when the negative signal VinN is in LOW, the current $I_P$ flows in the LD through the bonding wirer B1, then, the current to the LD becomes the superposed current Ibias+$I_P$. On the other hand, when the negative signal VinN is in HIGH, or when the positive signal VinP is in LOW, the current supplied to the LD is extracted from the bias current Ibias by the current $I_N$, then the extracted current becomes Ibias−$I_N$. Thus, the LD may be modulated by the signals, VinP and VinN, complementary to each other as shown in FIG. 2B.

Figure 3:
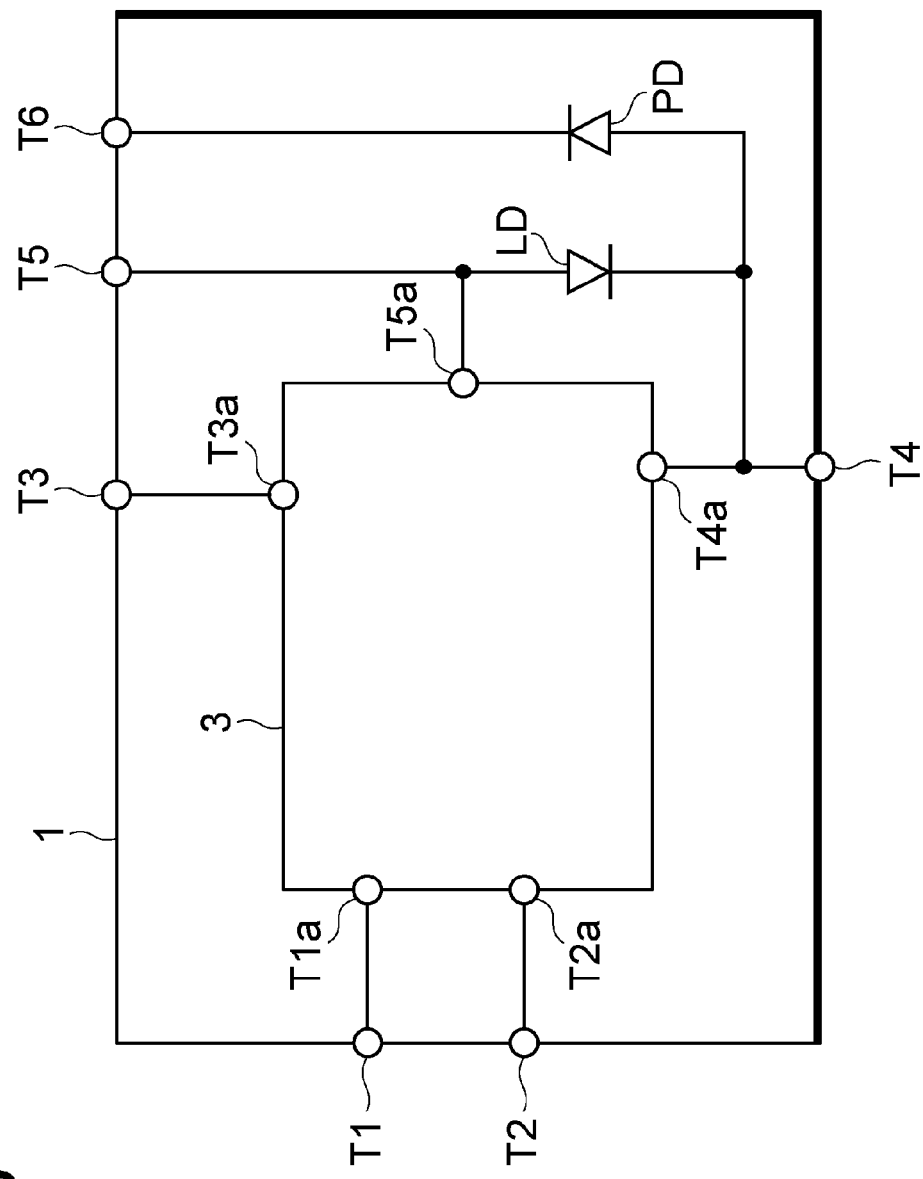
FIG. 3 is a functional block diagram of the optical transmitter.

FIG. 3 is a functional block diagram of the optical transmitter 1, which includes a driver 3, an LD, and a photodiode (hereafter denoted as PD). The optical transmitter shown in FIG. 3 is a type of the TOSA where the elements, 3, LD and PD, are installed within a package of the optical transmitter 1. The driver 3, by receiving driving signals, VinP and VinN, complementary to each other, generates the positive and negative currents, $I_P$ and $I_N$. The PD may monitor portion of light emitted from the LD to operate the APC.

The optical transmitter 1 has terminals, T1 to T6. The terminals, T1 and T2 receive the positive and negative signals, VinP and VinN, respectively, from an external circuit. The third terminal T3 is biased by the power supply Vcc, while, the fourth terminal is grounded. The terminal T5 receives the bias current Ibias from the external source shown in FIG. 1, and the last terminal T6 is provided for monitoring the output of the PD to operate the APC. The cathode of the LD is connected not only to the ground in the driver 3 but also to the terminal T4 connected to the external ground.

Figure 4:
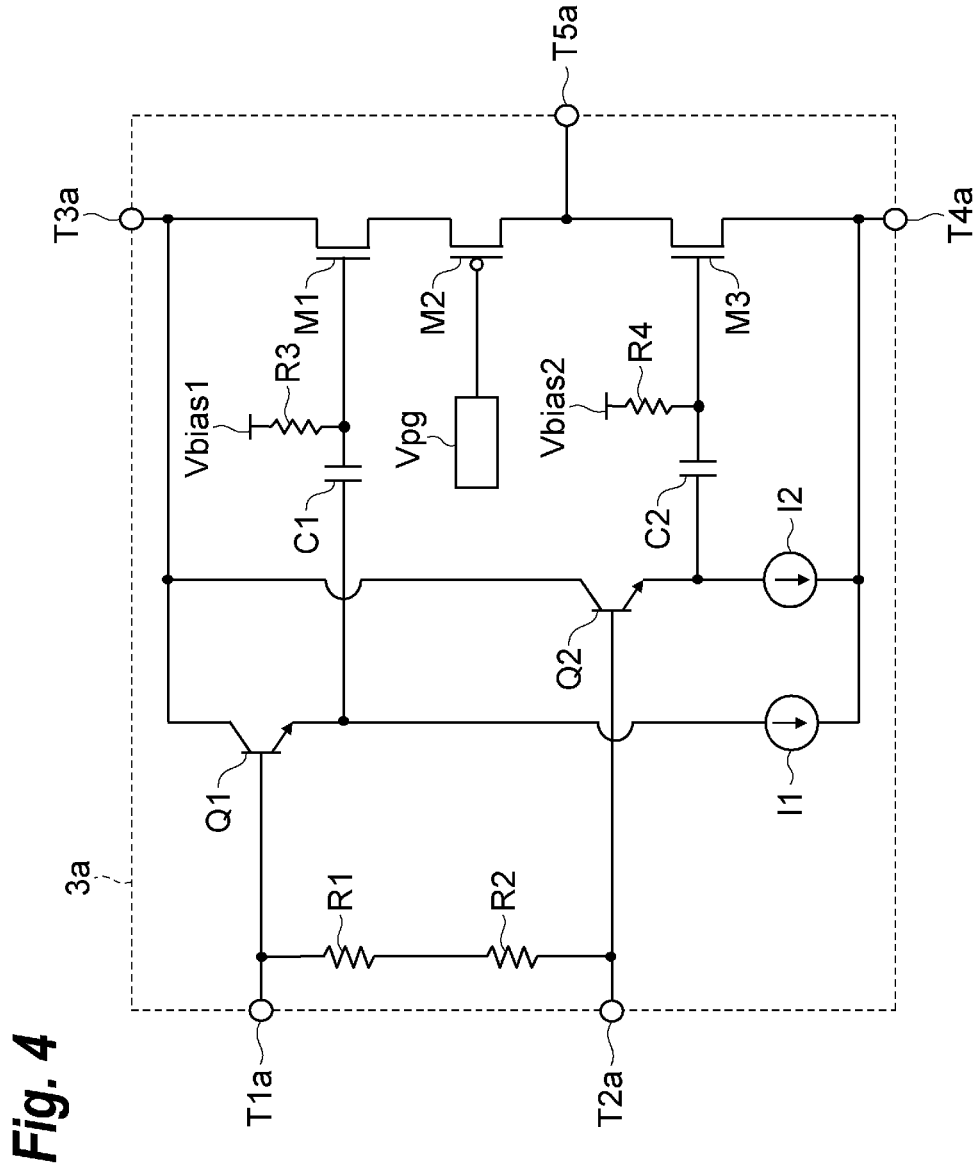
FIG. 4 is a circuit diagram of the driver according to the first embodiment of the present invention.

Specific examples of the driver 3 referred in FIGS. 1 and 3 will be described as referring to FIGS. 4 to 9. FIG. 4 shows a circuit diagram of the driver 3a according to the first embodiment of the invention. The driver 3a has terminals T1a to T5a; resistors, R1 to R4; npn transistors, Q1 and Q2; n-MOS transistors, M1 and M3; a p-MOS transistor M2; capacitors, C1 and C2; voltage biases, Vbias1, Vbias2 and Vpg; and current sources, I1 and I2.

The driver 3a includes a high side driver and a low side driver, the former of which is constituted by the transistors, Q1, M1, and M2, a capacitor C1, a resistor R3, a current source I1, and a voltage biases, Vbias1 and Vpg, to process the positive signal. While, the latter includes transistors, Q2 and M3, the capacitor C2, the resistor R4, and the current source I2 to process the negative signal VinN.

In the high side driver, which may be called as the push unit, the transistor Q1 is coupled with the input terminal T1a and the input resistor R1 in the base thereof. The collector of the transistor Q1 is biased by the power supply Vcc through the terminal T3a, while, the emitter thereof is grounded by the terminal T4a through the current source I1 and coupled with the FET M1 through the capacitor C1. The transistor M1 in the gate thereof is AC coupled with the emitter of the transistor Q1 to receive the voltage signal VinP, while, the source is connected to the drain of the FET M2. The former FET M1 is biased by Vbias1 through the resistor R3, while, the latter FET M2 is biased by the other source Vpg.

In the lower side unit, which maybe called as the pull unit, the transistor Q2 has the configuration same with those of the transistor Q1 but receives the negative phase signal VinN. The emitter is coupled with the third FET M3 through the capacitor C2. The drain of the FET M3 is coupled with the drain of the FET M2, while, the source thereof is directly grounded. The FET M3 is biased in the gate thereof by the reference Vbias2 through the resistor R4. The output of the driver 3a is drawn from the drain of the FET M3 to the terminal T5a. Thus Two resistors, R1 and R2, may constitute the input terminator each having resistance of 100Ω, where the input impedance of the driver may become 50Ω. Two transistors, Q1 and Q2, constitute the emitter follower to isolate respective inputs, VinP and VinN, from MOSFETs, M1 and M3, where these FETs, M1 and M3, often show relatively larger capacitance of parasitic capacitors, CGS, CGB and CGD, in order to suppress the degradation in the frequency bandwidth due to these capacitors. These FETs are necessary to be adequately biased. Accordingly, two FETS, M1 and M3 are coupled with respective emitter followers, Q1 and Q2, in the AC mode through capacitors, C1 and C2; and voltage bias sources, Vbias1, Vbias2, and Vpg, are provided independent to the FETs, M1 to M3.

Two bias sources, Vbias1 and Vbias2, are preferably prepared within the driver 3a, which may omit to prepare additional terminals. Moreover, two resistors, R3 and R4, preferably have larger resistance exceeding, for instance, a megaohm (MΩ) because a cut-off frequency of CR circuits, C1R3 and C2R4, is necessary to be in a range from 10 to 100 kHz but a capacitor monolithically integrated within the circuit is restricted in the capacitance thereof to several pico-farad (pF) at most.

The bias Vpg for the p-MOSFET M2 is also generated within the circuit 3a. Because the drain of the FET M2 is drawn to the terminal T5a, the output impedance of the circuit 3a becomes relatively large. When the FET M1 is directly drawn out to the terminal T5a, the other FET M3 in the lower side unit may draw a current from the power supply Vcc in the terminal T3a through the FET M1 not from the LD connected in the terminal T5a, which may suppress the current extract from the external bias current source connected in the terminal T5a, because the source of the FET M1 has lower impedance relative to that of the drain of the FET M2.

The optical transmitter 1 may show the power consumption thereof comparable to those of conventional transmitter implemented with the shunt-driver. The power consumption to drive the LD increases by the power consumption of the driver 3a but the current from the external bias source to the LD becomes nearly half of those of the conventional arrangement because the driver 3a may provide the superposed current and the extracted current. Thus, the total power consumption of the optical transmitter 1 becomes comparable to those of the conventional transmitters. Oppositely, because the driver 3a shows a higher trans-conductance, which is a ratio of the amplitude of the output current to the amplitude of the input voltage signal, circuits implemented in the upstream of the driver 3a may probably suppress the power consumption thereof.

Figure 5:
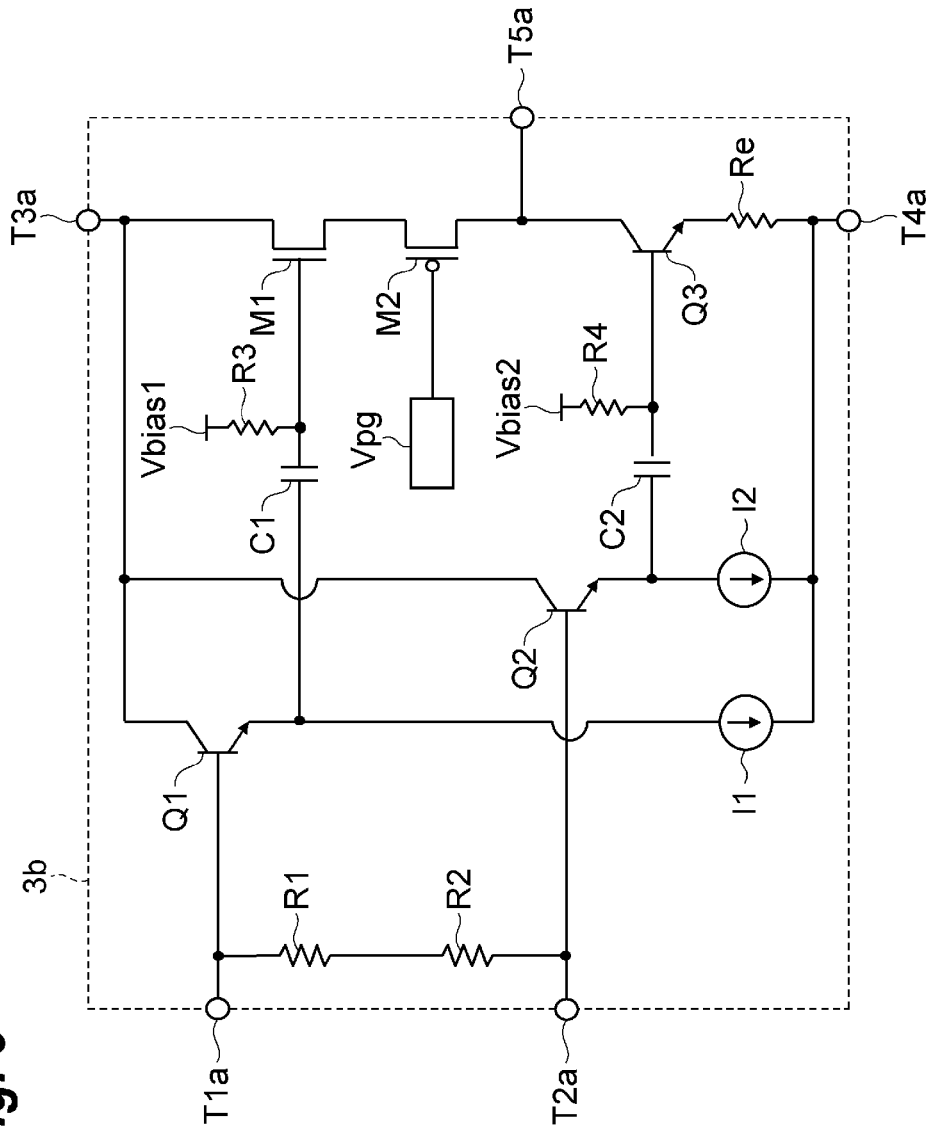
FIG. 5 is a circuit diagram of the driver according to the second embodiment of the present invention.
Figure 6:
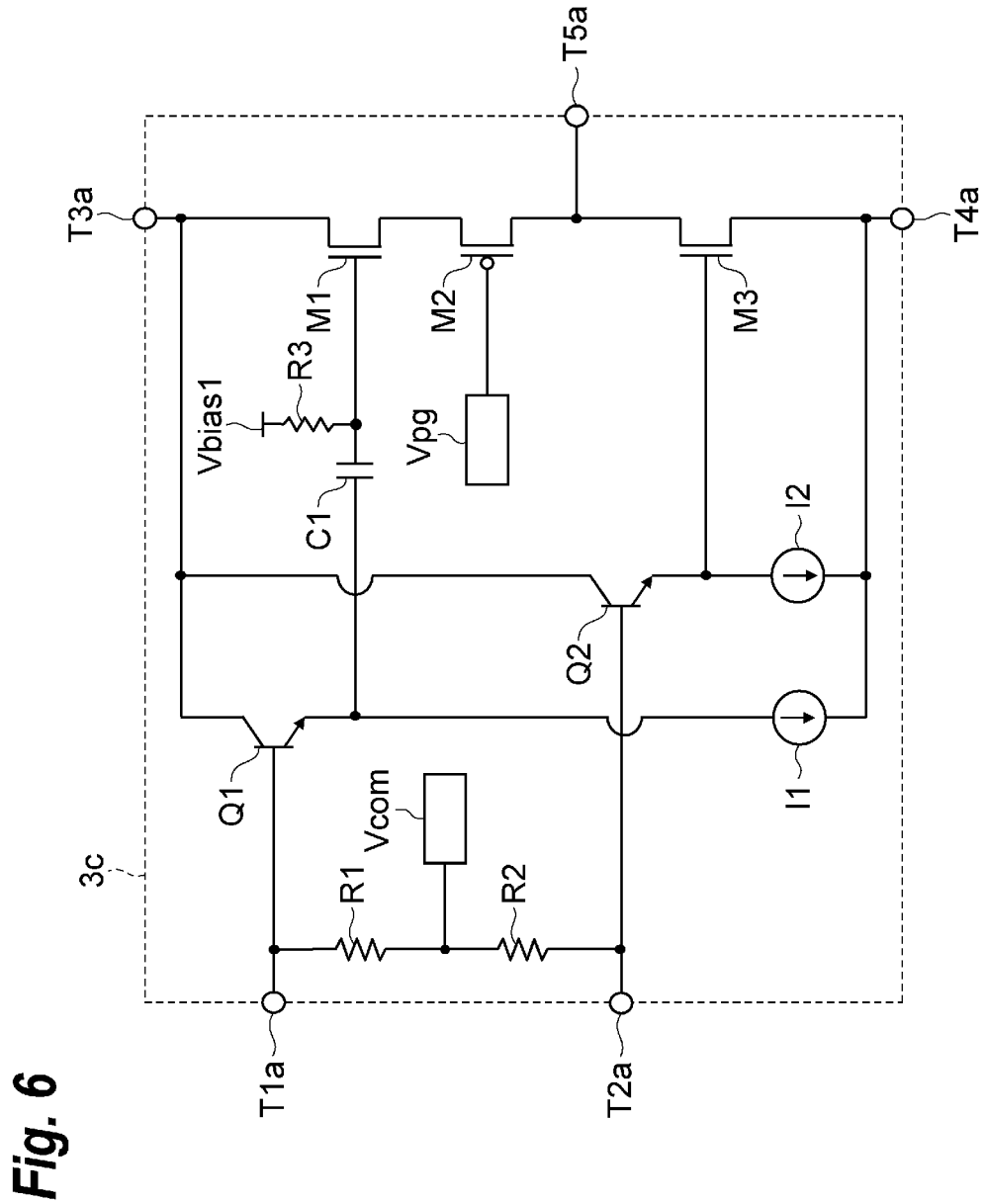
FIG. 6 is a circuit diagram of the driver according to the third embodiment of the present invention.

Another driver according to the second embodiment will be described as referring to FIG. 5. The driver 3b shown in FIG. 5 implements another transistor Q3 with an emitter resistor R3 in the low side driver instead of the FET M3 in FIG. 4. The transistor Q3, which is a type of npn transistor, with the emitter resistor Re, has the arrangement of the emitter follower. In this arrangement shown in FIG. 5, the second FET M2 may effectively suppress the transistor Q3 from drawing a current from power supply Vcc at the terminal T3a through the high side driver, and two emitter followers, Q1 and Q2, may effectively isolate input signals, VinP and VinN, from circuit elements inherently attributed to transistors, M1 and Q3.

Figure 7:
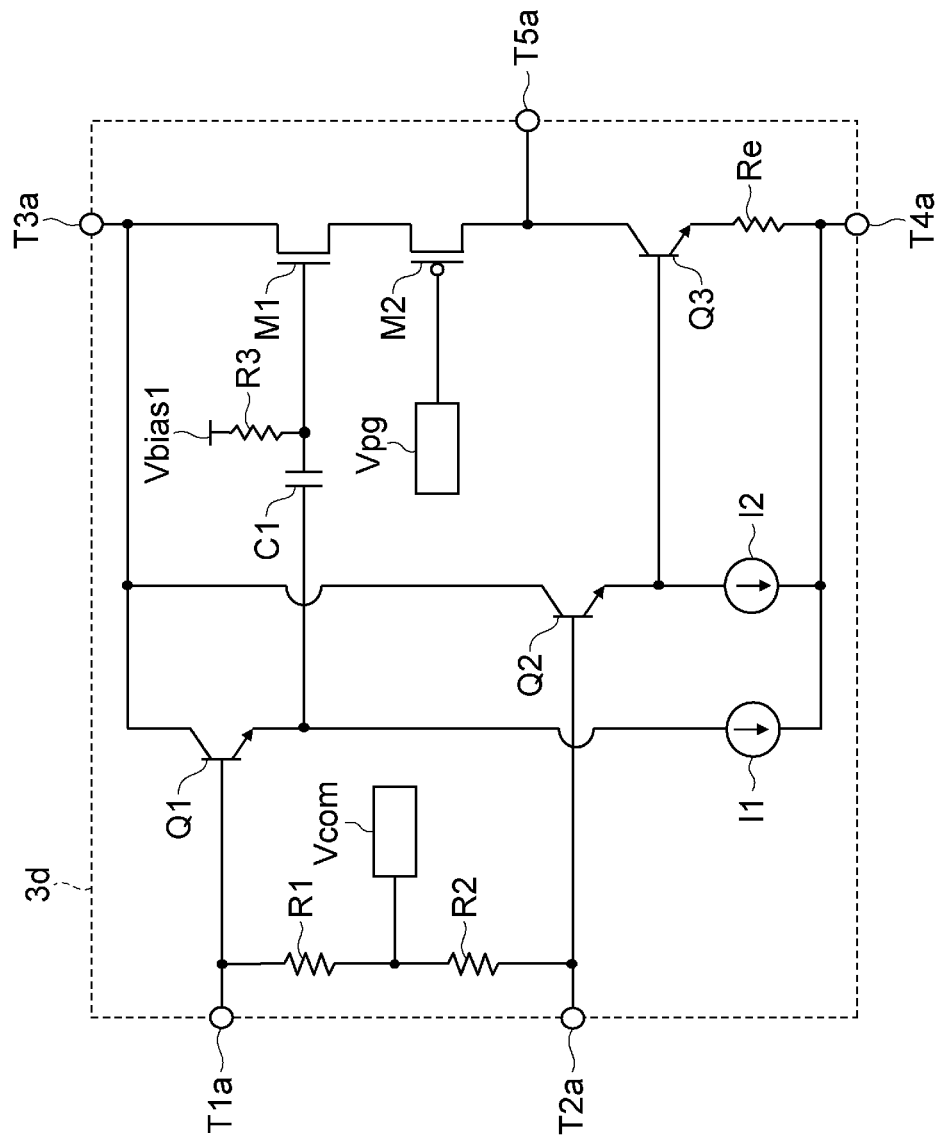
FIG. 7 is a circuit diagram of the driver according to the fourth embodiment of the present invention.

FIG. 7 shows still another embodiment of the driver 3c of the present invention. The driver 3c shown in FIG. 3 directly connects the emitter follower of the transistor Q2 to the FET M3, that is, the emitter of the transistor Q2 is coupled with the gate of the FET M3 without implementing any capacitors. In addition, the input terminals, T1a and T2a, or the bases of respective emitter followers, Q1 and Q2, are biased by a voltage source Vcom through respective input terminators, R1 and R2. Thus, the gate bias of the FET M3 may be provided by the voltage source Vcom even when the bias source Vbias2 is removed. Setting a voltage difference between the base and the emitter of a bipolar transistor to be $V_{be}$, which is the forwardly biased pn-junction and nearly equal to about 0.7V, the gate bias of the FET M3 becomes Vcom-$V_{be}$. An adequate gate bias of the nMOSFET is preferably 0.7 to 1.0V; accordingly, setting the voltage of the source Vcom to be around 1.5V, the circuit 3c may adequately drive the FET M3.

While, because a bias level around 2.7V or higher is necessary to drive the FET M1 in the high side driver, the independent voltage source Vbias1 with the resistor R3 and the coupling capacitor C1 to cut the DC level are still inevitable. The LD is necessary to be preferably biased over around 1.4V, in other words, the LD shows the forwardly bias voltage over 1.4V, and the FET M2 is necessary to be biased at least by 0.6V between the drain and the source thereof to operate stably. The former voltage appears in the terminal T5a. Accordingly, the gate of FET M1 is necessary to be biased at least 2.7V to operate it adequately.

FIG. 7 shows still another embodiment of the driver according to the present invention. The driver 3d shown in FIG. 7 replaces the FET M3 in the low side driver by a transistor Q3 with an emitter resistor R3 similar to the driver 3b shown in FIG. 5. The driver 3d may remove the second bias source Vbias2 and the resistor R4. The function and the operation of the input bias source Vcom are the same as those shown in the former drawing.

Figure 8:
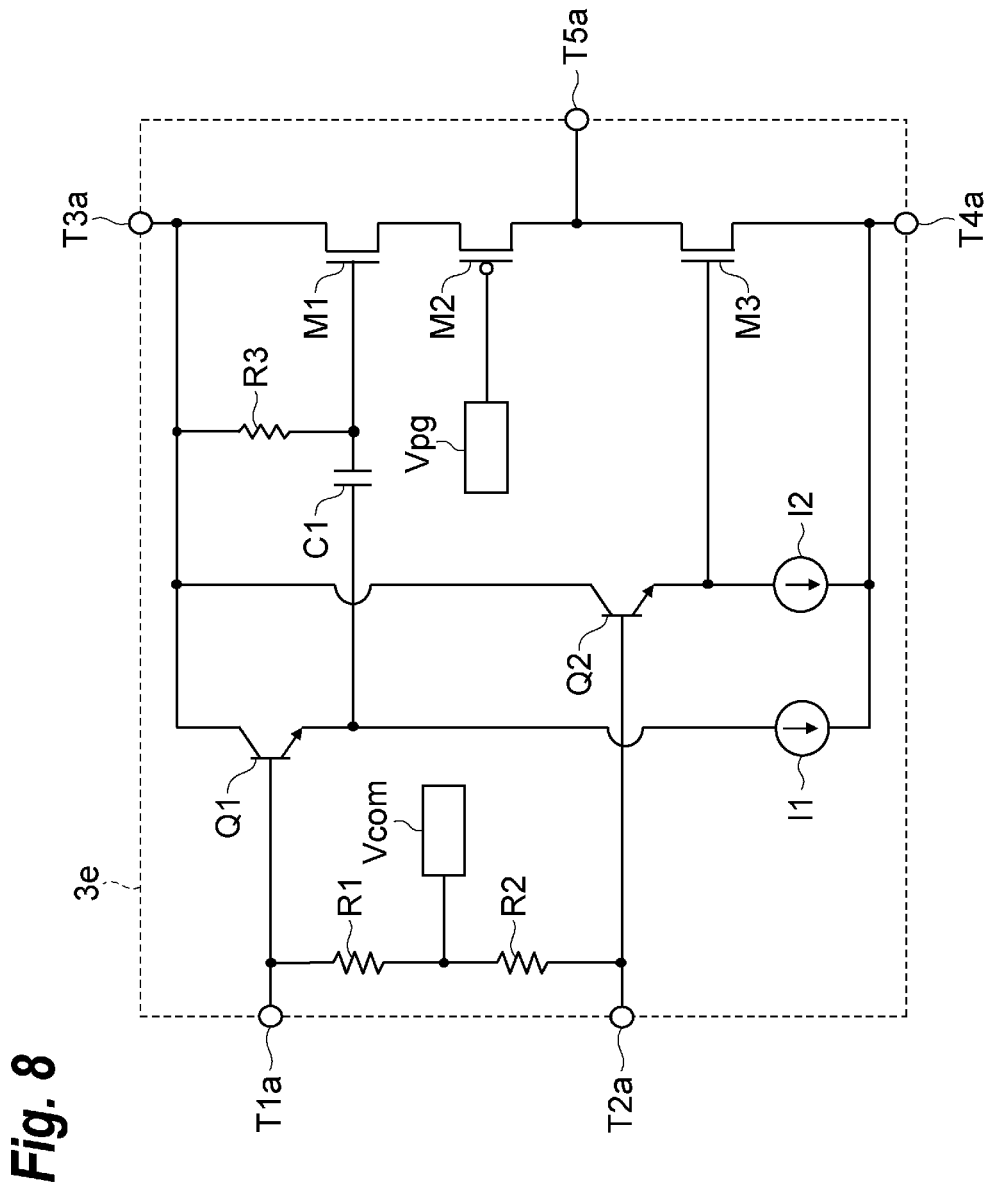
FIG. 8 is a circuit diagram of the driver according to the fifth embodiment of the present invention.

FIG. 8 shows another driver 3e of one of other embodiments according to the present invention. The driver 3e of FIG. 8 further removes the bias source Vbias1 compared with those 3c shown in FIG. 6. The FET M1 in the gate thereof is biased by the power supply Vcc in the terminal T3a through the resistor R3. Assuming the voltage of the gate of the FET M1, that of the source, that of the threshold, and that of the power supply are Vg0, Vx, Vthn and Vcc1, respectively, a condition of Vcc1−Vx>=Vg0−(Vx+Vthn), namely, Vcc1>=Vg0−Vthn, is necessary to operate the FET M1 in the saturation region. Putting the resistor R3 between the gate of the FET M1 and the power supply T3a, the condition above may be always satisfied. Thus, the power supply voltage Vcc1 may be lowered to 2.7V. In this arrangement shown in FIG. 8, the second FET M2 is biased by the voltage Vpg to operate the FET M2 in the saturation region.

Figure 9:
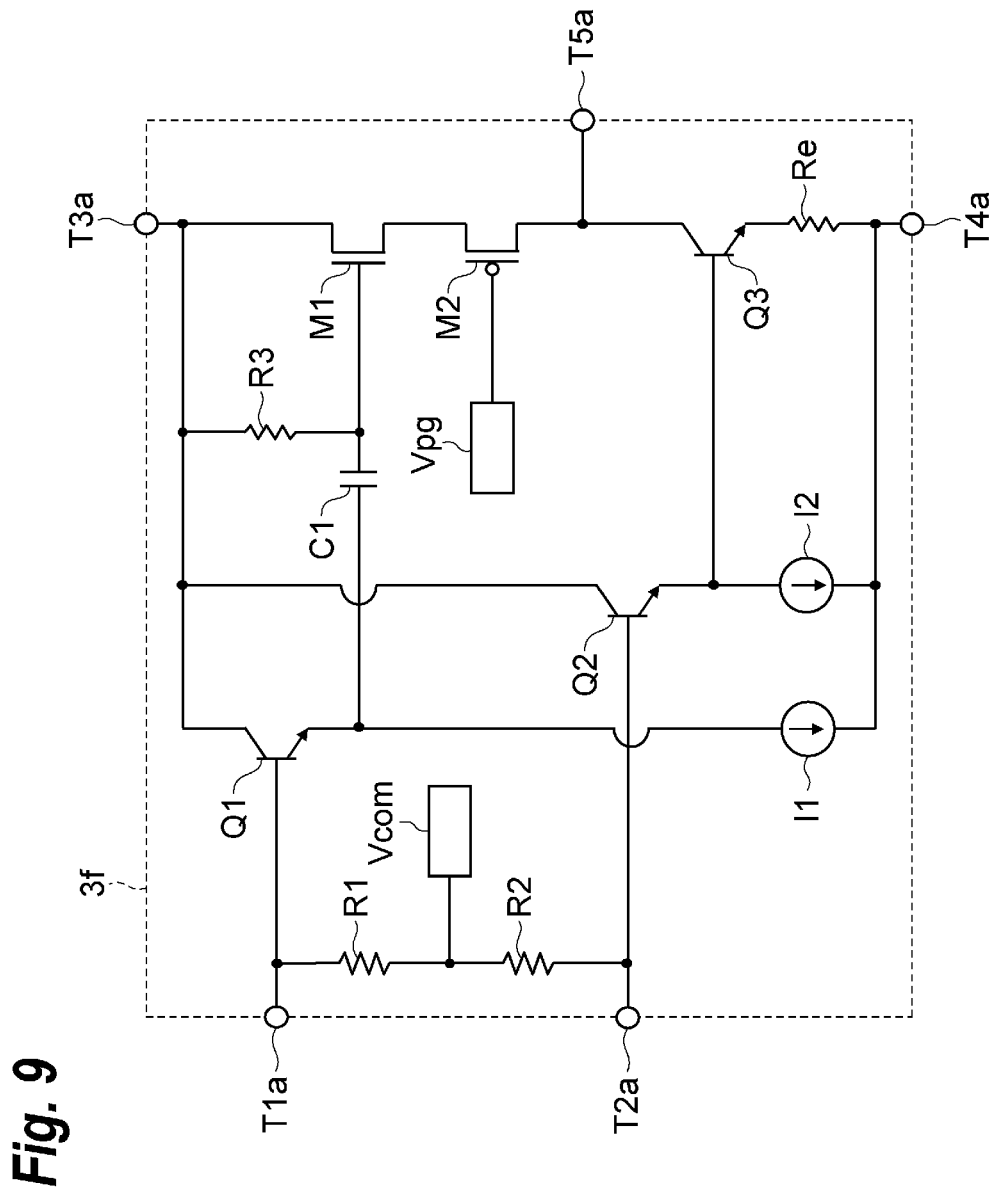
FIG. 9 is a circuit diagram of the driver according to the sixth embodiment of the present invention.
Figure 10:
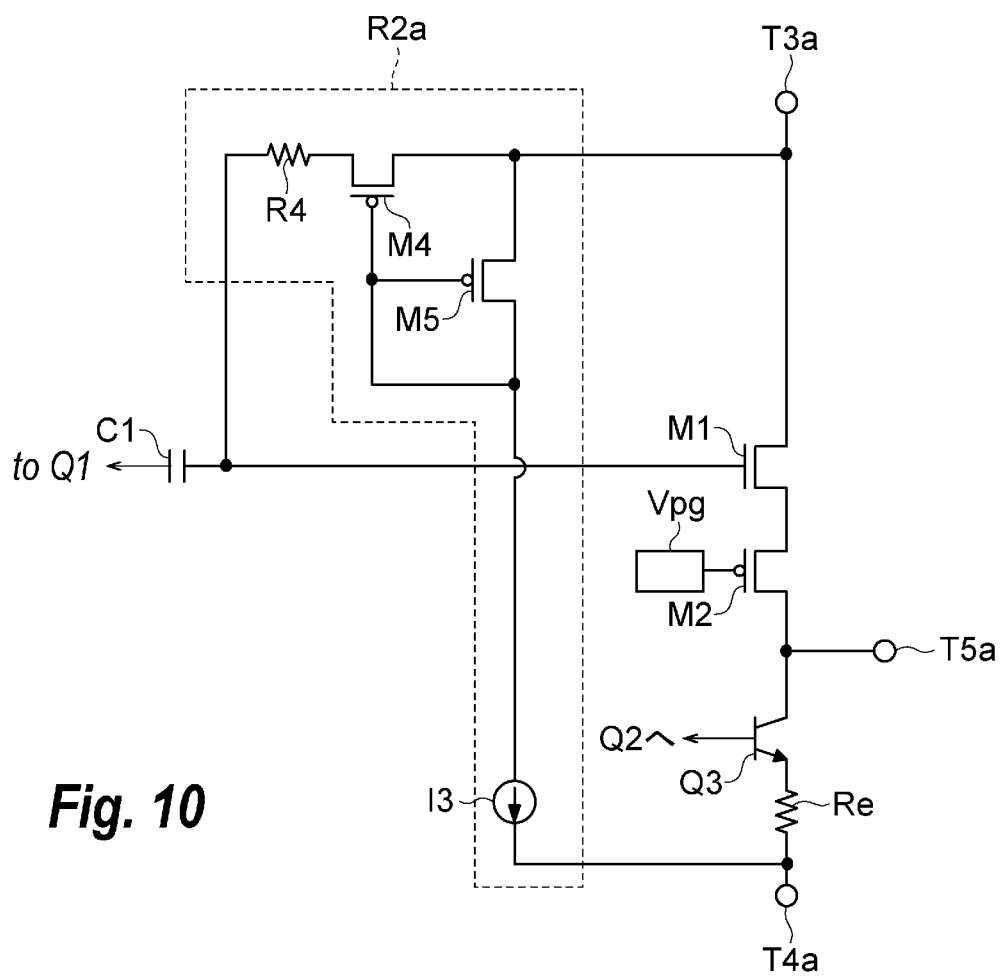
FIG. 10 is a circuit diagram of the driver according to the seventh embodiment of the present invention.

FIG. 9 shows still another arrangement of the driver circuit, which removes the first bias source Vbias1 compared with those shown in FIG. 7. The FET M1 is biased by the power supply Vcc at the terminal T3a through the resistor R3 similar to those shown in FIG. 8. Because the resistor R3 has resistance of several hundreds kilo-ohm (kΩ) or greater, a large area or length is necessary when the resistor R3 is made of poly silicon (Si) which is generally used for a resistor element within an integrated circuit. Another MOSFET operating in an unsaturated condition may be replaced to the resistor R3. FIG. 10 is an arrangement of the circuit using MOSFETs, M4 and M5, instead of the resistor R3 appeared in the drivers, 3e (FIGS. 8) and 3f (FIG. 9). The circuit shown in FIG. 10 includes a bias circuit R2a including two transistors, M4 and M5, of the p-type MOSFET, a resistor R4 and a current source I3. Two FETs, M4 and M5, constitute a current mirror circuit with an arrangement of, respective gates are commonly connected to the drain of the FET M5 that is grounded through the current source I3, respective sources are biased by the power supply, and the resistor R4 is connected to the drain of one of FETs M4. In an ordinary current mirror circuit, the current due to the current source I3 may be reflected in a current flowing in the FET M4 and the resistor R4. However, the resistor R4 in the arrangement shown in FIG. 10 is connected to the gate of the FET M1 and the capacitor, namely, the resistor R4 is substantially isolated in the DC mode; accordingly, the mirror current flowing in the resistor R4 and the FET M4 becomes substantially zero, which resultantly makes the FET M4 to be biased in the unsaturated region. The resistor R4 is to isolate the signal line connected to the gate of the FET M1 from the FET M4, exactly, from the parasitic capacitors attributed to the FET M4, and has resistance of hundreds ohms.

Figure 15:
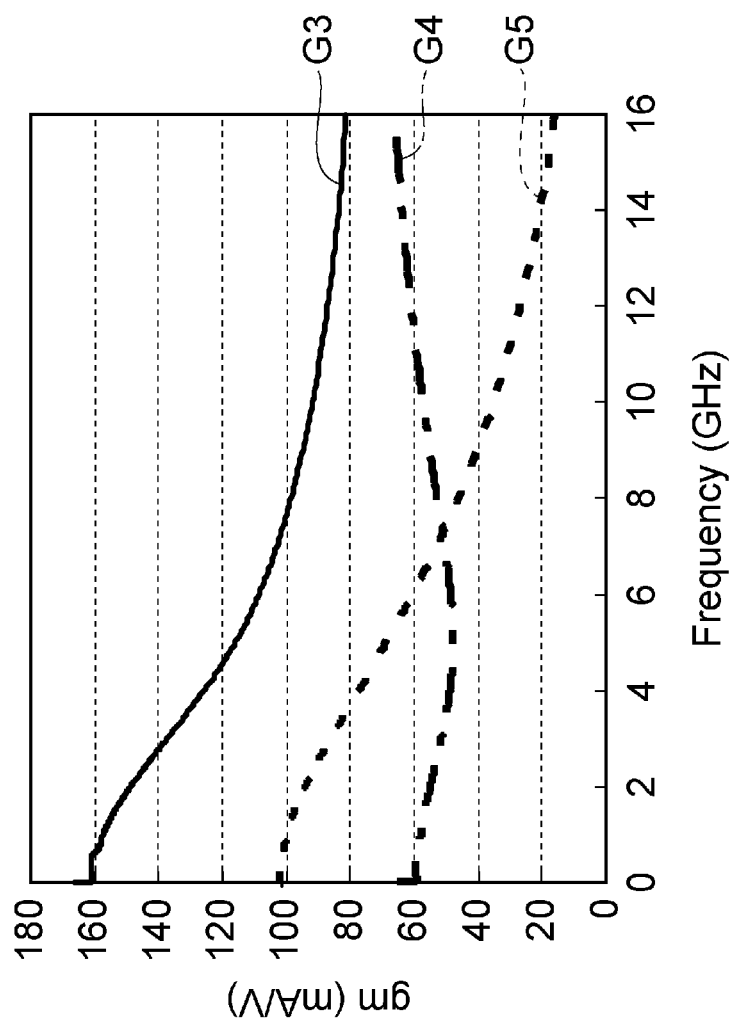
FIG. 15 shows frequency response of the trans-conductance of the low side driver, that of the high side drive, and that of the total trans-conductance reflected in the driver.

The optical transmitter 1 thus described above includes the driver 3, whose specific arrangements are shown FIGS. 4 to 10, with the push-pull type; accordingly, the transmitter 1 may reduce not only the power consumption thereof but the electro-magnetic interference (EMI), show a relatively large modulation capability, and make the assembly simple. Referring to FIG. 15, assuming that the trans-conductance of the high side driver is gm1 shown by a behavior G4, and that of the low side driver is gm2 by another behavior G5, the total trans-conductance of the driver 3, which is given by gm1+gm2, becomes those shown in the behavior G3. Thus, the total trans-conductance may be enhanced without degrading the bandwidth of the low side driver, and the resultant trans-conductance becomes relatively greater, which results in a greater amplitude of the modulation signal. In addition, because the trans-conductance of respective transistors may be restricted, or unnecessary to be pressed to enhance, the response thereof in high frequencies may be maintained.

Figure 11:
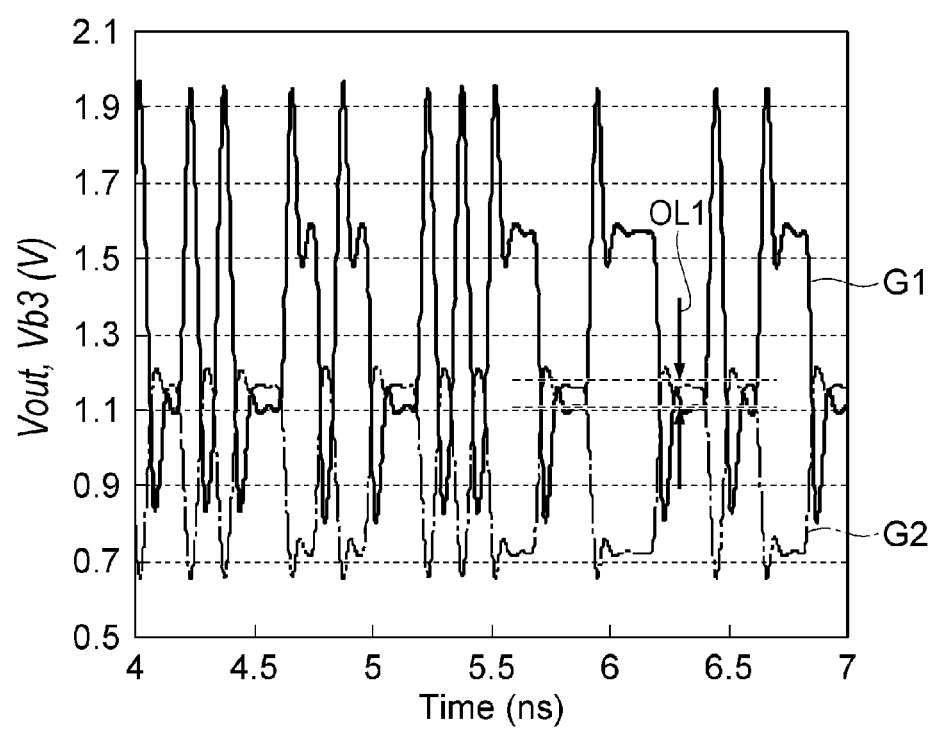
FIG. 11 is a time chart of the input of the output transistor in the low side driver and the output of the driver when the driver provides the high side driver.
Figure 12:
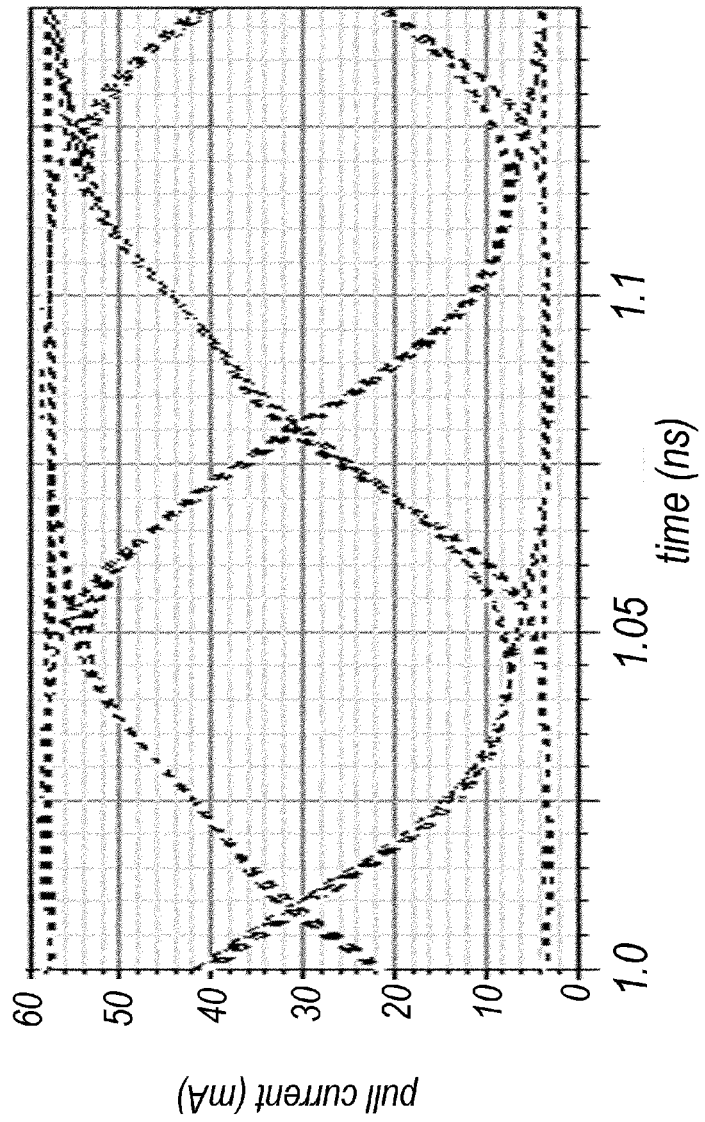
FIG. 12 shows an eye diagram of the pull-current output from the low side driver.
Figure 13:
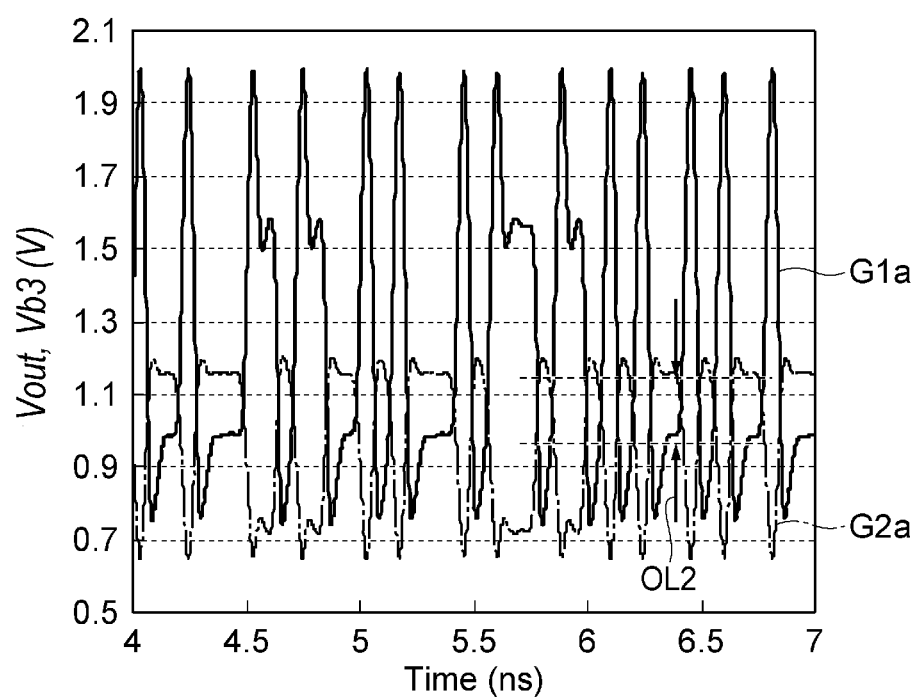
FIG. 13 is a time chart of the input of the output transistor in the low side driver and the output of the driver when the driver extrudes the high side driver.
Figure 14:
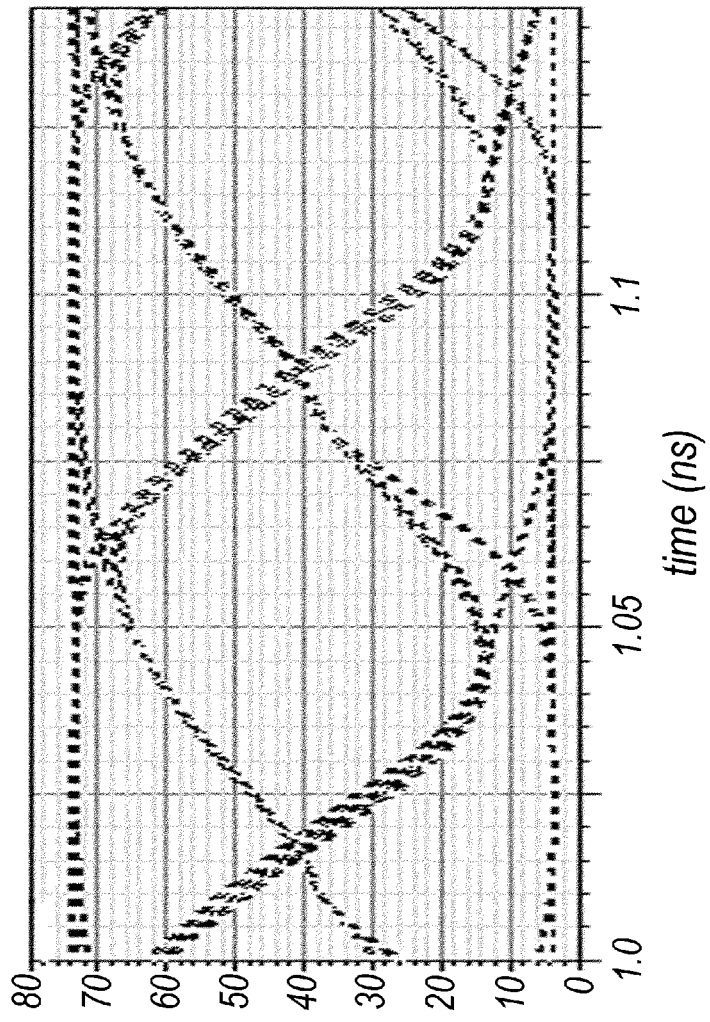
FIG. 14 shows an eye diagram of the pull-current output from the low side driver without the high side driver.

For instance, assuming the base input of the transistor Q3 and the collector output thereof are Vb3 and Vout, respectively, where the former corresponds to the waveform G2 while the latter to the waveform G1 in FIG. 11; their overlapping denoted by arrows OL1 in FIG. 11 becomes less than 0.1V when the trans-conductance of the transistor Q3 combined with the emitter resistor Re is small. Accordingly, the eye diagram of the pull current Ipull, which is the collector current of the transistor Q3, widely opens, as shown in FIG. 12. On the other hand, when the trans-conductance of the transistor Q3 combined with the emitter resistor Re is relatively large, which is shown in FIG. 13 where the waveform G1a corresponds to the output Vout while the other G2a corresponds to the input Vb3, the overlapping exceeds 0.2V as denoted by arrows OL2 in FIG. 13. In such a case, the collector current Ipull of the transistor Q3 shows a deformed or squashed pattern.

Thus, the optical transmitter 1 provides the high side driver that adds the current Ip to the bias current Ibias and the low side driver that absorbs the current In from the bias current Ibias. The high side driver includes a series circuit of the n-type MOSFET M1 and the p-type MOSFET M2, while, the low side driver includes the n-type MOSFET M3 or the npn transistor Q3. The optical transmitter 1 may decrease the power consumption without decreasing the high frequency performance. However, such an optical transmitter 1 sometimes lowers the trans-conductance of the high side driver compared with that inherently attributed thereto, which restricts to enhance the gain of the high side driver. Next, a modified optical transmitter will be described where the trans-conductance of the high side driver may be enhanced.

Figure 16:
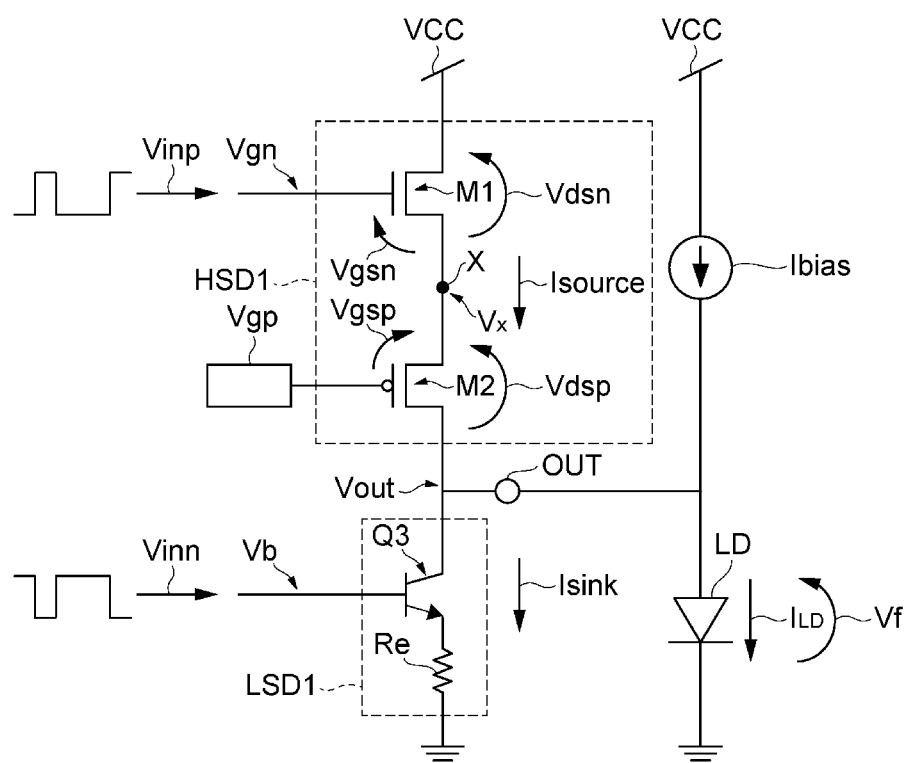
FIG. 16 explains a mechanism to reduce the trans-conductance of the high side driver.
Figure 17:
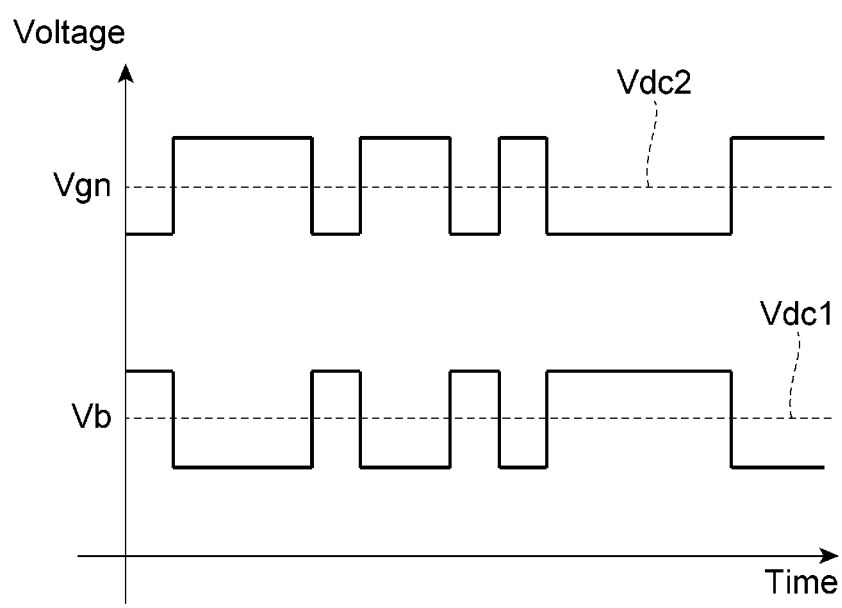
FIG. 17 shows the DC bias and AC signals applied to the high side driver and the low side driver.

First, a reason why the high side driver restricts the trans-conductance thereof will be first described as referring to FIGS. 16 and 17. FIG. 16 schematically illustrates the driver 3 including the high side driver HSD1 and the low side driver LSD1. The high side driver HSD1 includes the series circuit of two FETs, M1 and M2; while, the low side driver LSD1 includes the transistor Q3 with the emitter resistor Re.

In FIG. 16, the FET M1 is biased by Vgn, Vdsn, and Vgsn where Vgn is the gate bias, Vgsn is the bias between the gate and the source, and the Vdsn is the bias between the drain and the source; while, the FET M2 is biases by Vgp, Vgsp, and Vdsp where Vgp is the gate bias, Vgsp is the bias between the gate and the source, and Vdsp is the bias between the drain and the source. In addition, the output of the driver appeared at the terminal T5a is assumed to Vout, and the forward bias of the LD is Vf. The high side driver and the low side driver receive signals, Vinp and Vinn, which swing around respective gate biases, Vgn and Vb, as shown in FIG. 16.

A status where the positing input Vinp is in HIGH while the negative input Vinn is in LOW is first considered. In such a case, the high side driver turns ON, while, the low side driver is OFF; equivalently, the current Isource from the power supply Vcc increases, which also increases the bias Vgsp of the FET M2. Because the gate input Vgp is constant, the voltage of the node X between two FETs, M1 and M2 increases, which results in the decrease of the bias Vgsn and decreases the current Isource. This is generally called as the current feedback of the FET M1, and the trans-conductance thereof decreases.

Figure 18B:
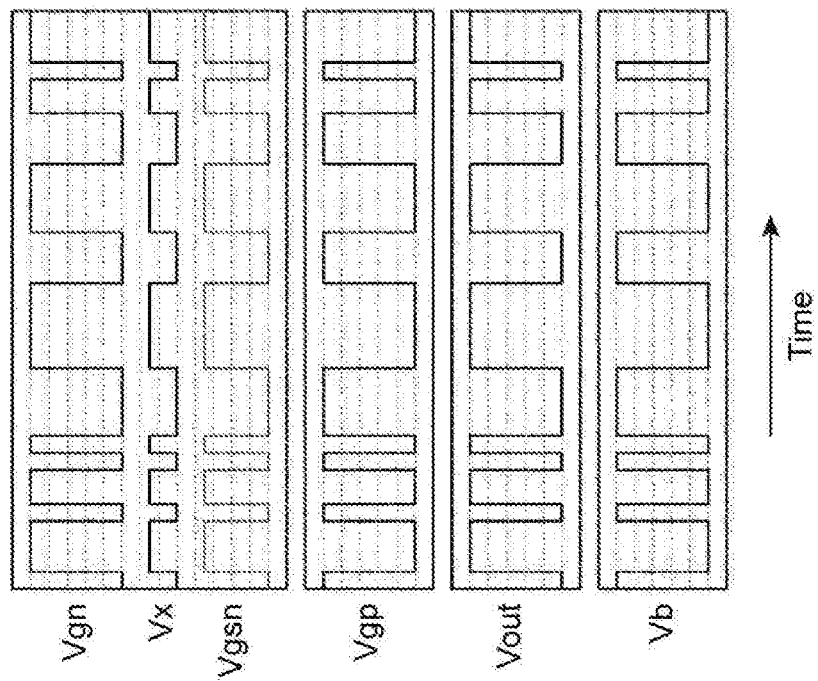
FIG. 18B is a time chart thereof when the p-MOSFET is driven by the negative phase signal.
Figure 18A:
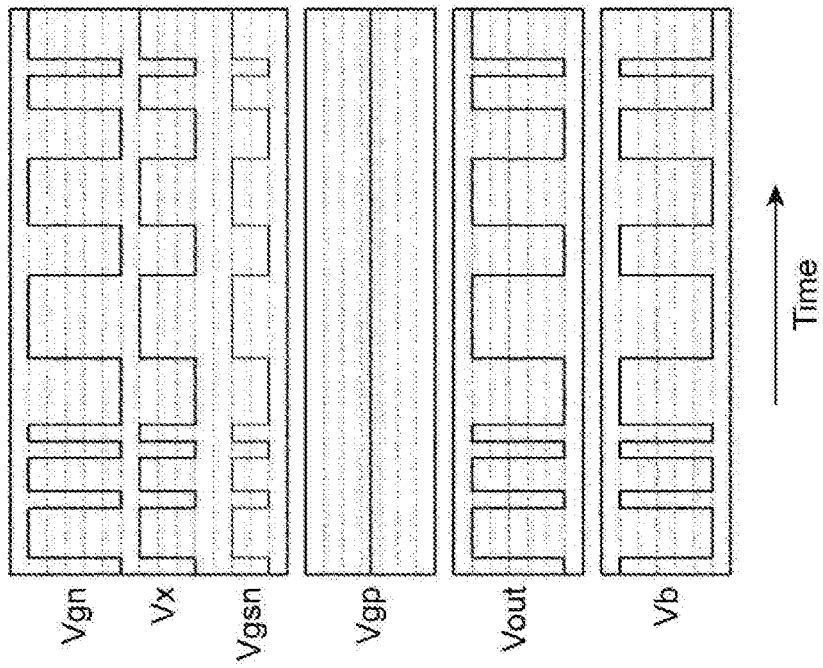
FIG. 18A is a time chart of respective biases when the p-MOSFET is fixedly biased.

When the positive phase signal Vinp is in LOW, while, the negative phase signal is in HIGH, which is the status that the high side driver is OFF and the low side driver is ON; the gate bias Vgsp of the FET M2 decreases because the current Isource decreases, which lowers the voltage Vx of the node X because the gate input Vgp is set constant. This operation results in a condition to widen the gate bias Vgsp, then the bias condition of the FET M1 does not directly reflect the amplitude of the positive phase signal Vinp. FIG. 18A schematically illustrates behaviors of biases, Vgn, Vx, Vgsn, Vgp, Vout, and Vb, of the FETs, M1 and M2.

The current feedback described above is caused by the fluctuation of the node X between two FETs, M1 and M2. When the lower FET M2 is modulated by a signal whose phase synchronizes with the negative phase input Vinp, this fluctuation of the node voltage Vx may be effectively suppressed as shown in FIG. 19, where symbols appears in the figure have meanings same with those in FIG. 17; however the signal Vinn' input to the FET M2 is derived from the negative phase input Vinn but the amplitude thereof is different therefrom.

One of the cases where the high side driver is in ON and the low side driver is in OFF is first considered. The positive phase signal Vinp in HIGH state thereof increases the current Isource, then, the gate bias Vgsp of the p-MOSFET M2 increases while the gate input Vgp of the FET M2 is in LOW in such status; accordingly, the FET M2 turns on to decrease the bias Vdsp between the drain and the source thereof, which may suppress the increase of the not voltage Vx compared with the arrangement shown in FIG. 16 where the gate input Vgp is stayed constant. Thus, the increase of the output level Vout maybe secured.

On the other hand, when the high side driver is in OFF and the low side driver is in ON, the current Isource flowing in the FET M1 decreases, which causes the level Vx of the node X between two FETs, M1 and M2, to be close to the gate input Vgp of the FET M2. However, the gate input Vgp of the present embodiment is in HIGH. Accordingly, the gate bias Vgsn of the upper FET M1 is suppresses to decrease compared with the arrangement of FIG. 16, which may equivalently secure the trans-conductance of the high side driver. FIG. 18B schematically shows the behaviors of respective biases, Vgn, Vx, Vgsn, Vgp, Vout, and Vb.

Figure 19:
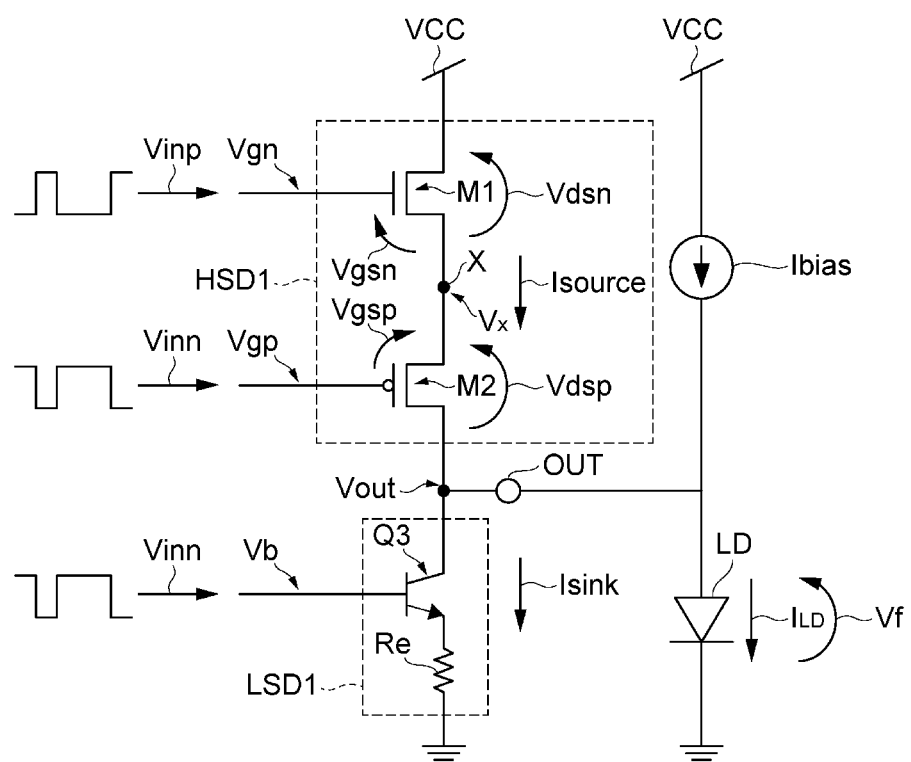
FIG. 19 explains a mechanism to enhance the trans-conductance of the high side driver by modulating the p-MOSFET.
Figure 20:
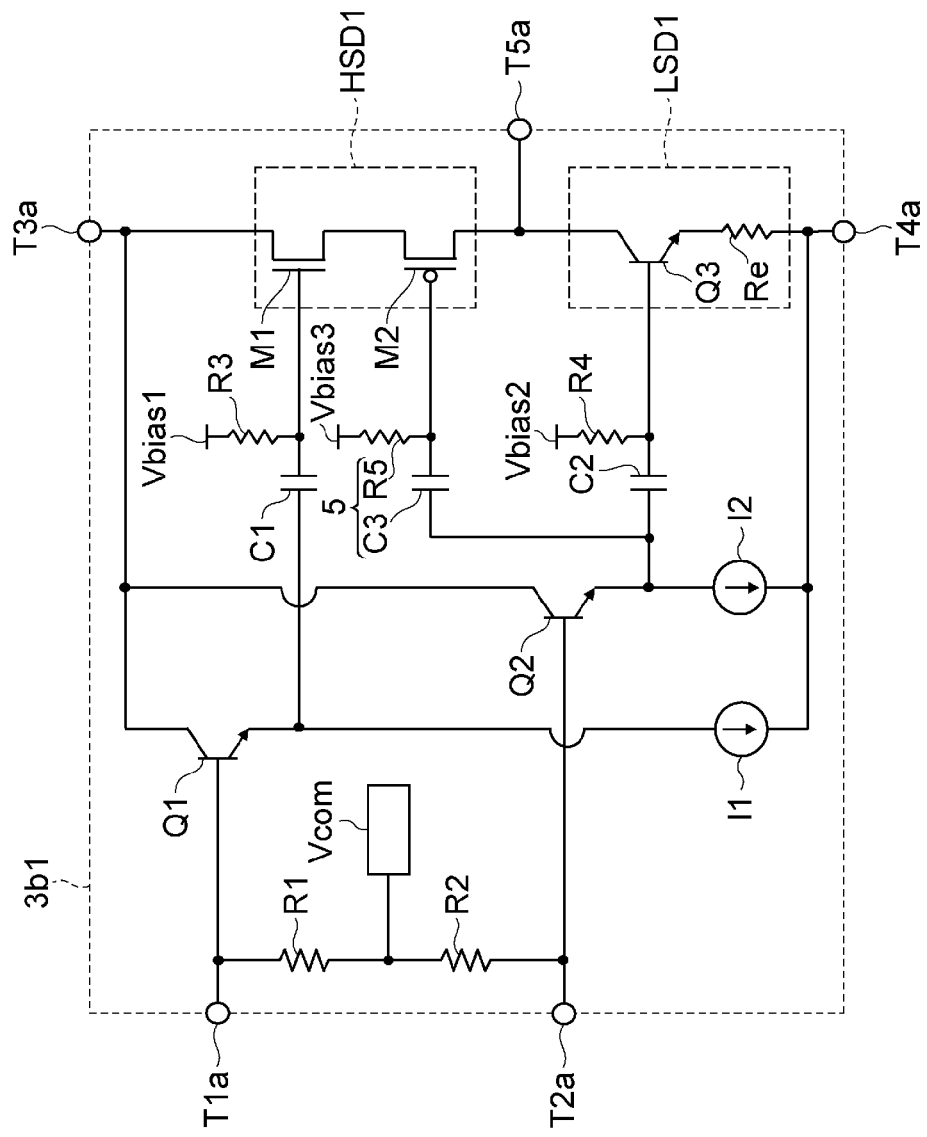
FIG. 20 is a circuit diagram of the driver according to the eighth embodiment of the invention, the circuit having with the arrangement that the p-MOSFET is driven by the negative phase signal.
Figure 21:
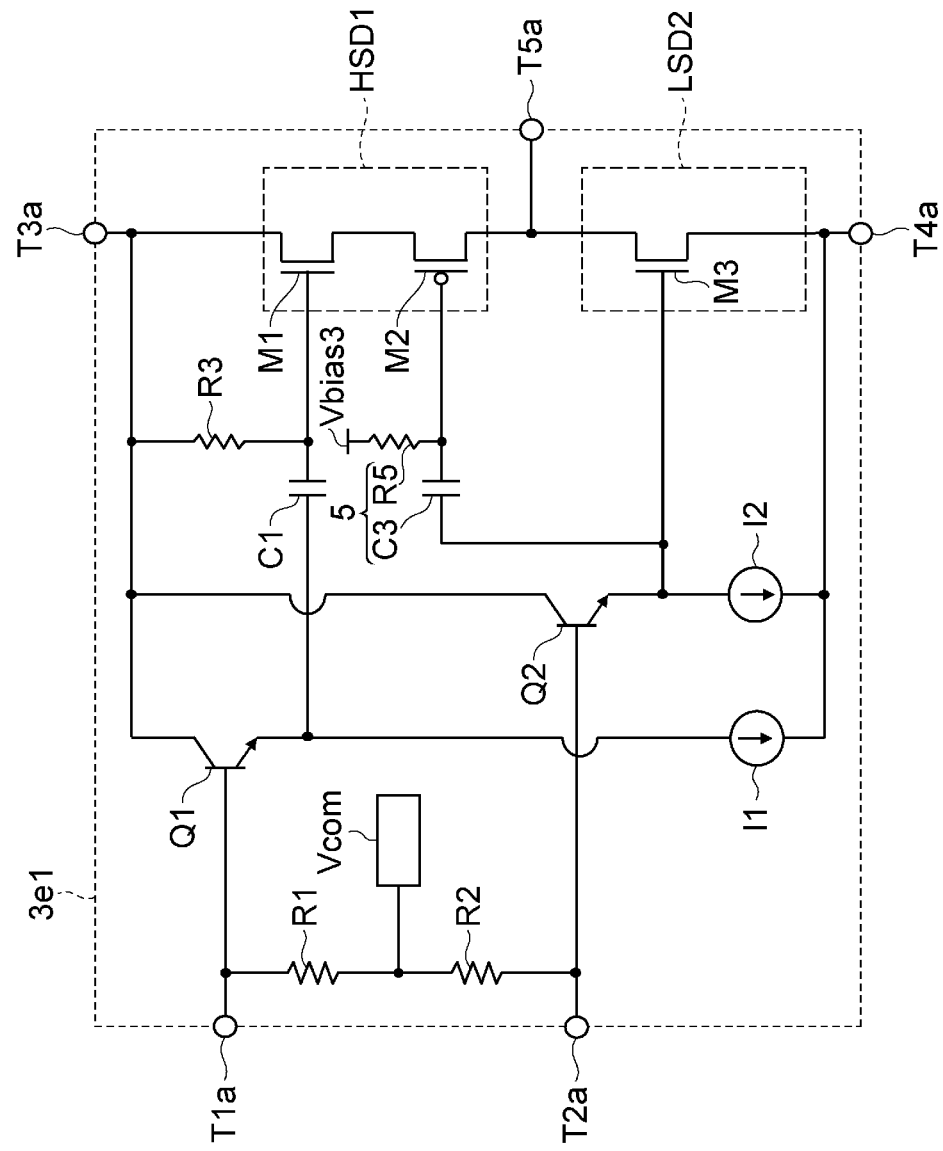
FIG. 21 is a circuit diagram of the driver according to the ninth embodiment of the present invention.
Figure 22:
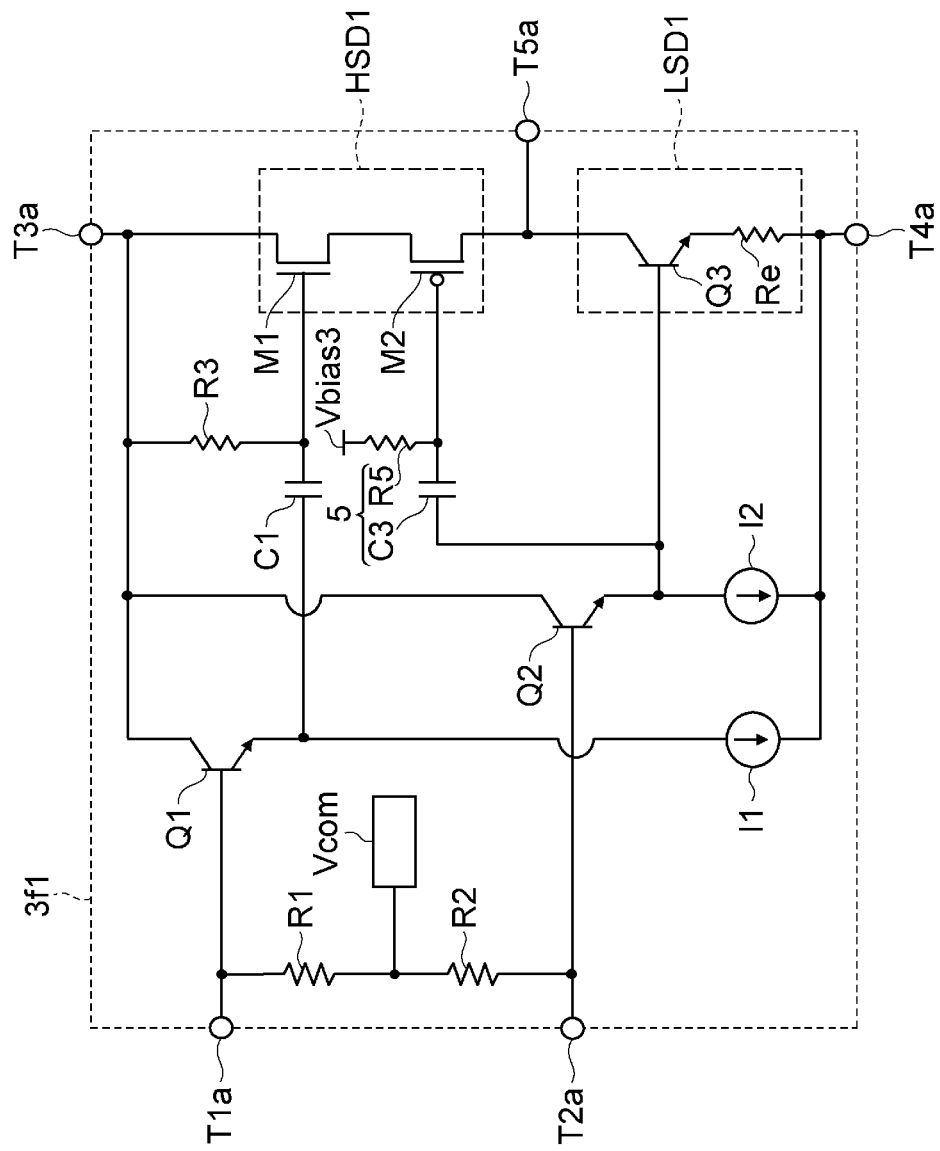
FIG. 22 is a circuit diagram of the driver according to the eleventh embodiment of the present invention.

FIGS. 20 to 22 show embodiments practically reflecting the mechanism described in accordance with FIG. 19. These circuits add an additional circuit to arrangements of FIGS. 5, 8 and 9, to modulate the p-MOSFET M2. The gate biasing circuit 5 includes a resistor R5 with relatively high resistance and a capacitor C3 to cut the DC level of the output of the emitter follower Q2. The p-MOSFET M2 in the gate thereof is biased by the voltage Vbias 3 through the resistor R3.

The driver 3b1 shown in FIG. 20 adds the gate biasing circuit 5 and a voltage source Vcom to bias the input transistors, Q1 and Q2. The p-MOSFET M2, which is biased by the voltage Vbias3 trough the resistor R3, receives the output of the emitter follower Q2, which has the same phase with that of the Vinn of the low side driver. The drivers, 3e1 and 3f1, shown in FIGS. 21 and 21, respectively, each adds the gate biasing circuit 5 same as those shown in FIG. 20. In the driver 3e1 of FIG. 21, the low side driver LSD2 is comprised of an n-MOSFET M3 as those shown in FIGS. 4, 6, and 8; while, the driver 3f1 of FIG. 22 includes a bipolar transistor Q3 with the emitter resistor Re in the low side driver LSD1.

Thus, the gate biasing circuit 5 for the p-MOSFET M2 may suppress the decrease of the trans-conductance of the high side driver HSD1. The signal output from the transistor M1 driven by the positive phase signal Vinp is provided to the output through the p-MOSFET M2. When the p-MOSFET M2 is fixedly biased, the p-MOSFET M2 sometimes causes the decrease of the amplitude of the output from the FET M1. The present embodiments may suppress the reduction of the output amplitude of the driver by modulating the p-MOSFET M2 by the negating phase signal.

Figure 23:
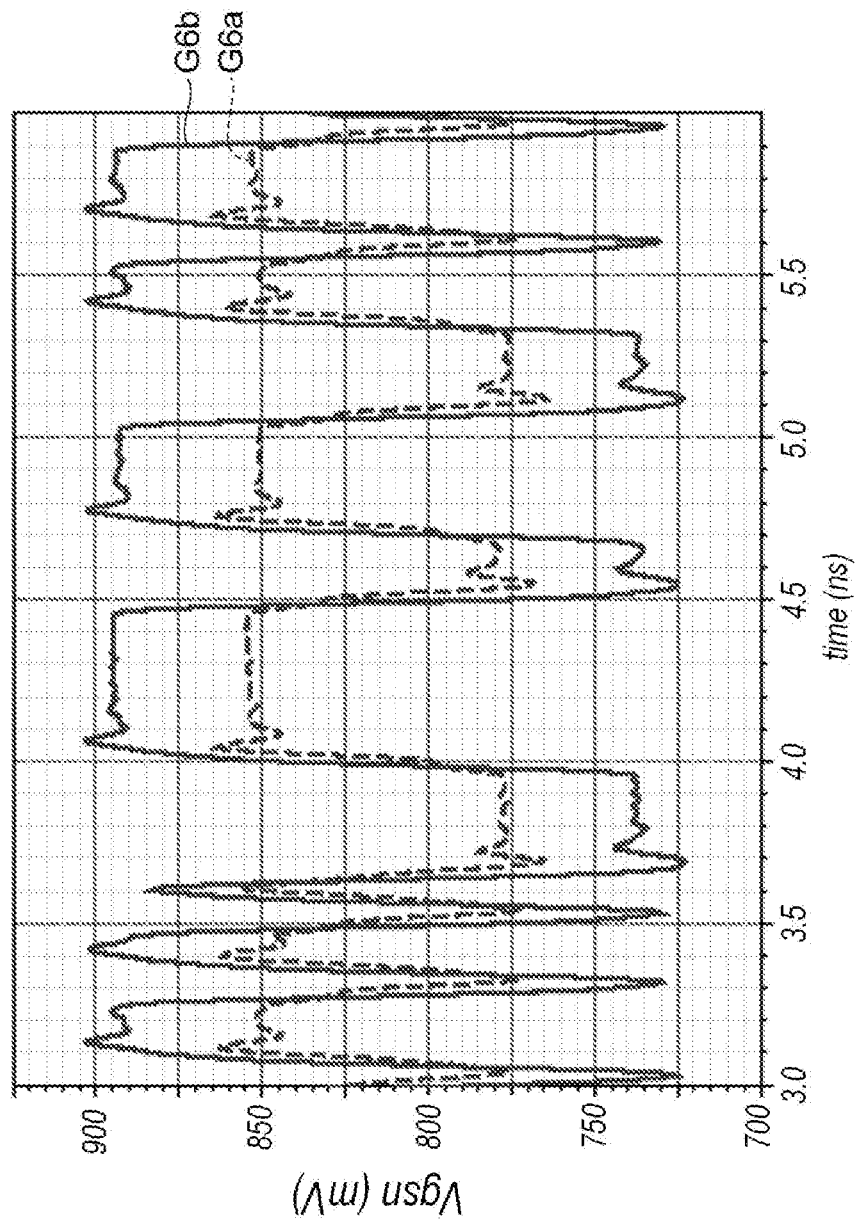
FIG. 23 compares the bias between the gate and the source when the p-MOSFET is fixedly biased or driven by the negative phase signal.
Figure 24:
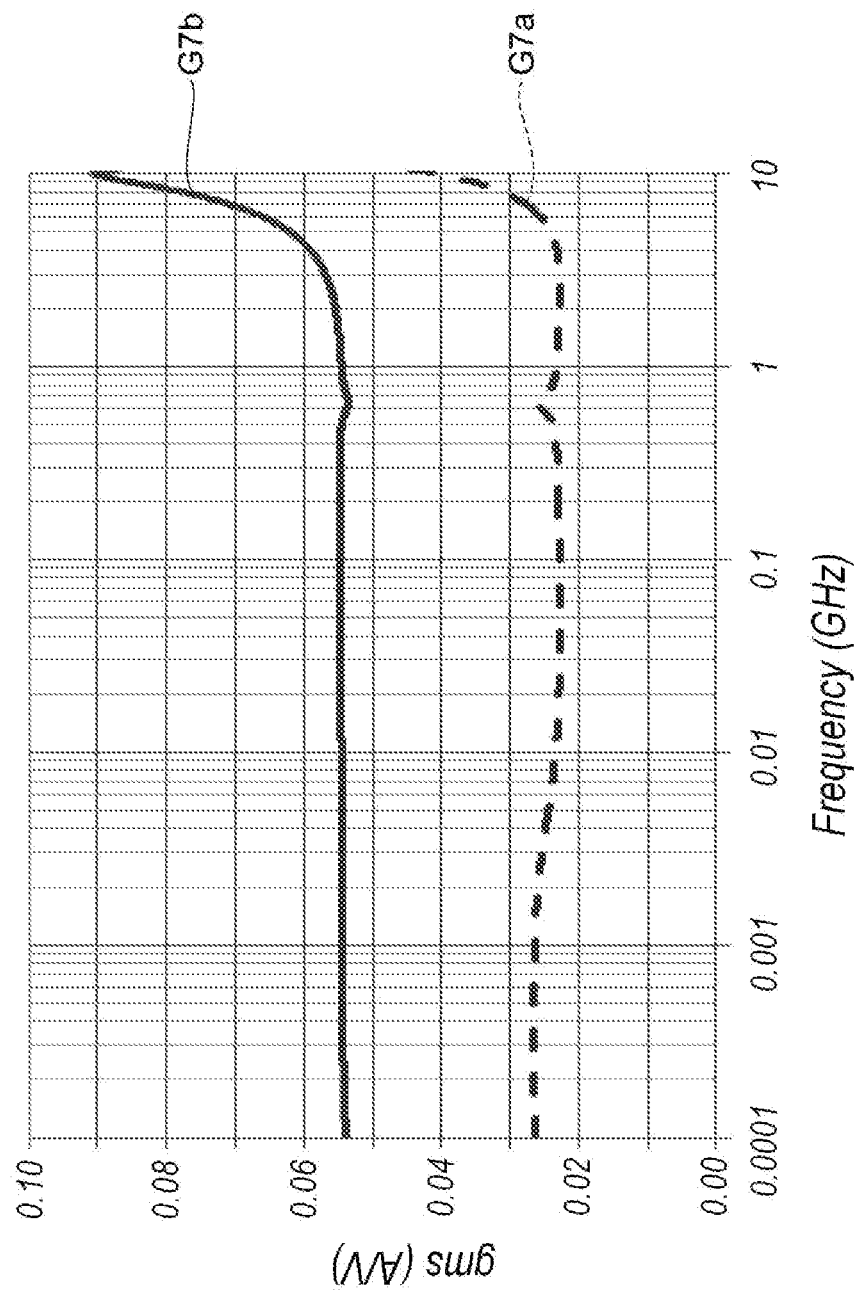
FIG. 24 compares the frequency response of the trans-conductance of the output transistor in the high side driver when the p-MOSFET is fixedly biased or driven by the negative phase signal.

FIGS. 23 and 24 compare the function of the gate biasing circuit for the p-MOSFET M2 by the bias Vgsn between the gate and the source (FIG. 23) and the frequency response of the trans-conductance gms (FIG. 24) of the high side driver with the biasing circuit 5 for the p-MOSFET M2. Behaviors G6a in FIG. 23 and G7a in FIG. 24 correspond to the circuit without modulating the p-MOSFET M2, while, G6b and G7b show results of the circuit with the gate biasing circuit 5.

Referring to FIG. 23, the behavior G6b is almost double in the magnitude thereof compared with the behavior G6a; while, the response G7b in FIG. 24 is also double in the magnitude thereof compared with the behavior G7b. Thus, the effect to modulate the p-MOSFET M2 is apparently reflected in the output of the high side driver.

Although the present invention has been fully described in conjunction with the preferred embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A laser diode driver to drive a semiconductor laser diode, the driver being driven with a positive phase signal and a negative phase signal complementary to each other, comprising:
   a high side driver including a series circuit of a first MOSFET and a second MOSFET, the first MOSFET having a conducting type different from a conducting type of the second MOSFET, the first MOSFET being driven by the positive phase signal, the high side driver providing a positive current to the semiconductor laser diode when the positive phase signal is in HIGH; and
   a low side driver driven by the negative phase signal, the low side driver extracting a negative current from the semiconductor laser diode.

2. The laser diode driver of claim 1, wherein the second MOSFET is fixedly biased.

3. The laser diode driver of claim 1, wherein the second MOSFET is driven by the negative phase signal.

4. The laser diode driver of claim 1, wherein the low side driver includes a third MOSFET driven by the negative phase signal.

5. The laser diode driver of claim 4, wherein the low side driver further includes an emitter follower to receive the negative phase signal, and wherein the third MOSFET is coupled with the emitter follower in DC mode.

6. The laser diode driver of claim 1, wherein the low side driver includes a bipolar transistor driven by the negative phase signal.

7. The laser diode driver of claim 6, wherein the low side driver includes an emitter follower to receive the negative phase signal, and wherein the bipolar transistor is coupled with the emitter follower in DC mode.

8. An optical transmitter, comprising:
   a semiconductor laser diode;
   a bias current source to provide a bias current to the laser diode;
   a driver driven by a positive phase signal and a negative phase signal complementary to each other, the driver including,
      a high side driver including a series circuit of a first MOSFET and a second MOSFET, the first MOSFET having a conducting type different from a conducting type of the second MOSFET, the first MOSFET being driven by the positive phase signal to add a positive current to the bias current when the positive signal is in HIGH, and
      a low side driver driven by the negative phase signal to extract a negative current from the bias current when the negative signal is in HIGH.

9. The optical transmitter of claim 8, wherein the second MOSFET is fixedly biased.

10. The optical transmitter of claim 8, wherein the second MOSFET is driven by the negative phase signal.

11. The optical transmitter of claim 8, wherein the low side driver includes a third MOSFET driven by the negative phase signal.

12. The optical transmitter of claim 11, wherein the low side driver further includes an emitter follower to receive the negative phase signal, the third MOSFET being coupled with the emitter follower in DC mode.

13. The laser diode driver of claim 8, wherein the low side driver includes a bipolar transistor driven by the negative phase signal.

14. The laser diode driver of claim 13 wherein the low side driver includes an emitter follower to receive the negative phase signal, the bipolar transistor being coupled with the emitter follower in DC mode.

\* \* \* \* \*